(12) United States Patent
Choi et al.

(10) Patent No.: US 7,602,633 B2
(45) Date of Patent: Oct. 13, 2009

(54) NON-VOLATILE MEMORY DEVICE, METHOD OF MANUFACTURING THE SAME, AND METHOD OF OPERATING THE SAME

(75) Inventors: Byung-Yong Choi, Gyeonggi-do (KR); Choong-Ho Lee, Gyeonggi-do (KR); Kyu-Charn Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 135 days.

(21) Appl. No.: 11/946,737

(22) Filed: Nov. 28, 2007

(65) Prior Publication Data

US 2008/0130349 A1    Jun. 5, 2008

(30) Foreign Application Priority Data

Nov. 30, 2006    (KR) .................. 10-2006-0119580

(51) Int. Cl.
*G11C 11/00* (2006.01)
(52) U.S. Cl. .................. 365/148; 365/163; 257/4; 257/E45.003; 438/104
(58) Field of Classification Search .......... 365/148, 365/163, 63; 257/4, E45.003; 438/104
See application file for complete search history.

(56) References Cited

U.S. PATENT DOCUMENTS 7,016,222 B2    3/2006    Morikawa
7,057,922 B2    6/2006    Fukumoto
7,098,496 B2 *  8/2006    Li et al. .................. 257/295
7,254,050 B2 *  8/2007    King .................. 365/71
7,426,128 B2 *  9/2008    Scheuerlein .................. 365/63

FOREIGN PATENT DOCUMENTS

JP    2002-170374    6/2002

OTHER PUBLICATIONS

English language abstract of Japanese Publication No. 2002-170374.

* cited by examiner

*Primary Examiner*—Pho M Luu
*Assistant Examiner*—Toan Le
(74) *Attorney, Agent, or Firm*—Marger Johnson & McCollom, P.C.

(57) ABSTRACT

A non-volatile memory device includes a substrate, resistance patterns, a gate dielectric layer, a gate electrode pattern, a first impurity region and a second impurity region. The substrate has recesses. The recesses are filled with the resistance patterns. The resistance patterns include a material having a resistance that is variable in accordance with a voltage applied thereto. The gate dielectric layer is formed on the substrate. The gate electrode pattern is formed on the gate dielectric layer. The first and second impurity regions are formed in the substrate. The first impurity region and the second impurity region contact side surfaces of the resistance patterns. Further, the resistance patterns, the first impurity region and the second impurity region define a channel region. Thus, the non-volatile memory device may store data using a variable resistance of the resistance patterns so that the non-volatile memory device may have excellent operational characteristics.

19 Claims, 6 Drawing Sheets

NON-VOLATILE MEMORY DEVICE, METHOD OF MANUFACTURING THE SAME, AND METHOD OF OPERATING THE SAME

CROSS-REFERENCE TO RELATED APPLICATION

This application claims the benefit of foreign priority under 35 USC § 119 to Korean Patent Application No. 2006-119580 filed on Nov. 30, 2006, the contents of which are herein incorporated by reference in its entirety for all purposes.

BACKGROUND

1. Field of Invention

Exemplary embodiments described herein relate generally to non-volatile memory devices, methods of manufacturing the same and methods of operating the same. More particularly, exemplary embodiments described herein relate to a non-volatile memory device including a variable resistance material, a method of manufacturing the same, and a method of operating the same.

2. Description of the Related Art

Generally, non-volatile memory devices may be classified as floating gate-type memory devices or charge trap-type memory devices in accordance with the structure of unit cell incorporated therein.

The unit cell of a typical floating gate-type non-volatile memory device includes a tunnel oxide layer, a floating gate, a dielectric layer and a control gate sequentially formed on a semiconductor substrate. The floating gate-type non-volatile memory device may store information by charging/discharging electrons into/out of the floating gate.

In contrast, the unit cell of a typical charge trap-type non-volatile memory device includes a tunnel insulation layer including silicon oxide, a charge-trapping layer including silicon nitride, a blocking layer including silicon oxide, and an electrode including doped polysilicon sequentially formed on a semiconductor substrate. Information may be programmed in the charge trap-type non-volatile memory device by storing charges in the charge-trapping layer between the electrode and the semiconductor substrate. Information may be erased from the charge trap-type non-volatile memory device by discharging the charges from the charge-trapping layer.

The floating gate-type non-volatile memory device and the charge trap-type non-volatile memory device may program or erase data in a cell using charges. However, in these conventional non-volatile memory devices, charges may be undesirably discharged due to interference between adjacent cells. This may cause malfunction of the non-volatile memory device.

Further, a NOR-type non-volatile memory device may be programmed according to a hot carrier injection process. Thus, a punch-through effect may be frequently generated between a source region and a drain region during the programming process. Furthermore, conventional NOR-type non-volatile memory devices typically require a high voltage of about 10V in order to operate. To apply such a high voltage to the NOR-type non-volatile memory device, elements such as a high voltage transistor need to be formed in a core region and a peripheral region of a substrate. As a result, the NOR-type non-volatile memory device may become undesirably large in size.

SUMMARY

Exemplary embodiments described herein may be characterized as providing a non-volatile memory device having a low malfunction characteristic due to interference between cells and a low operation voltage. Exemplary embodiments described herein may also be characterized as providing a method of manufacturing the above-mentioned non-volatile flash memory device. Exemplary embodiments described herein may further be characterized as providing a method of operating the above-mentioned non-volatile flash memory device.

One embodiment exemplarily described herein may be generally characterized as a non-volatile memory device that includes a substrate having recesses and resistance patterns filling the recesses. The resistance patterns may include a material having a resistance that is variable in accordance with a voltage applied thereto. A gate dielectric layer may be formed on the substrate. A gate electrode pattern may be formed on the gate dielectric layer. First and second impurity regions may be formed at a surface of the substrate. The first and second impurity regions may contact side surfaces of the resistance patterns to define a channel region between the resistance patterns.

Another embodiment exemplarily described herein may be generally characterized as a method of manufacturing a non-volatile memory device. The method may include implanting impurities into a surface of a substrate to form first and second impurity regions, partially etching the substrate to form recesses exposing the first and second impurity regions below the surface of the substrate, filling the recesses with resistance patterns, forming a gate dielectric layer on the substrate and forming a gate electrode pattern on the gate dielectric layer.

Yet another embodiment exemplarily described herein may be generally characterized as a method of operating a non-volatile memory device comprising a plurality of cells, wherein each of the plurality of cells includes recesses formed in a substrate, resistance patterns filling the recesses, a gate dielectric layer formed on the substrate, a gate electrode pattern formed on the gate dielectric layer and covering the resistance patterns and first and second impurity regions formed at a surface portion of the substrate, wherein the resistance patterns include a material having a resistance that is variable in accordance with a voltage applied thereto, wherein the first and second impurity regions formed at a surface of the substrate, the first and the second impurity regions contacting side surfaces of the resistance patterns to define a channel region between the resistance patterns. The method of operating such a non-volatile memory device may, for example, include applying a first voltage to the first impurity region of a one of the plurality of cells to decrease a resistance of the resistance pattern contacting the first impurity region, thereby programming the one of the plurality of cells with data. The method of operating such a non-volatile memory device may also include, for example, applying a second voltage to the first impurity region of the one of the plurality of cells to increase the resistance of the resistance pattern contacting the first impurity region, thereby erasing the data from the one of the plurality of cells. The method of operating such a non-volatile memory device may further include, for example, applying a reading voltage to the gate electrode and the second impurity region of the one of the plurality of cells and measuring a current flowing from the first impurity region to the second impurity region of the one of the plurality of cells to read the data in the one of the plurality of cells.

BRIEF DESCRIPTION OF THE DRAWINGS

The above and embodiments will become readily apparent by reference to the following detailed description when considered in conjunction with the accompanying drawings wherein.

DETAILED DESCRIPTION

Figure 1:
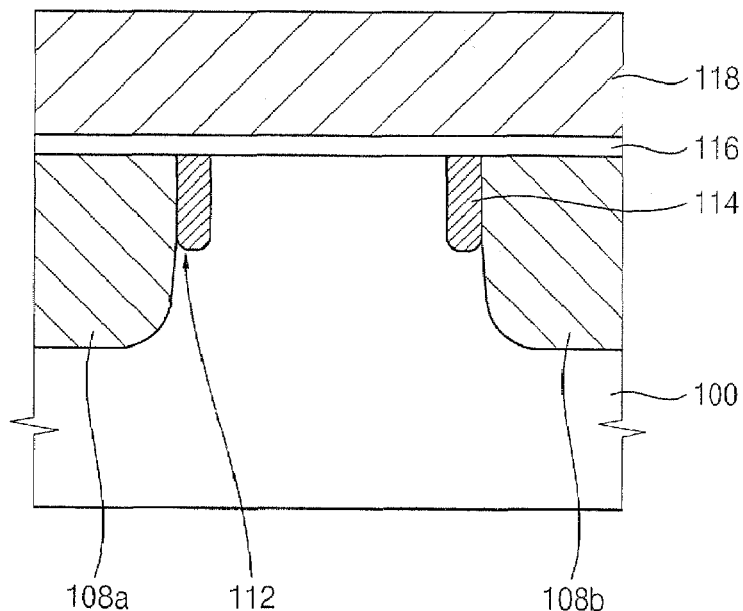
FIG. 1 is a cross-sectional view illustrating a first exemplary embodiment of a non-volatile memory device.

Exemplary embodiments of the present invention are described more fully hereinafter with reference to the accompanying drawings. These embodiments may, however, be realized in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments exemplarily described herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention as defined in the claims. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Non-Volatile Memory Device Including a Resistant Material

FIG. 1 is a cross-sectional view illustrating a first exemplary embodiment of a non-volatile memory device.

Referring to FIG. 1, a semiconductor substrate 100 is prepared. In one embodiment, the semiconductor substrate 100 may, for example, include single crystalline silicon.

Two recesses 112 are formed at a surface portion of the semiconductor substrate 100. A region of the semiconductor substrate 100 between the recesses 112 may correspond to a channel region.

The recesses 112 may be filled with resistance patterns 114. The resistance patterns 114 may include material having a resistance that is variable in accordance with a voltage applied thereto (hereinafter referred to as a "variable resistance material"). For example, when a voltage applied to both ends of the resistance patterns 114 is not less than about a reference voltage, the resistance patterns 114 may have a relatively low resistance. In contrast, when the voltage applied to both ends of the resistance patterns 114 is not more than about the reference voltage, the resistance patterns 114 may have a relatively high resistance.

In one embodiment, upper surfaces of the resistance patterns 114 may be substantially coplanar with an upper surface of the semiconductor substrate 100. Further, the resistance pattern 114 may include a material such as metal oxide. Examples of the metal oxide may include zirconium oxide, tantalum oxide, or the like or a combination thereof.

A gate dielectric layer 116, e.g., an oxide layer, may be formed on the semiconductor substrate 100 and on the resistance patterns 114. In one embodiment, the gate dielectric layer 116 may include a material such as silicon oxide, or the like.

A gate electrode pattern 118 may be formed on the gate dielectric layer 116 to cover the resistance patterns 114. In one embodiment, the gate electrode pattern 118 may, for example, include polysilicon doped with impurities, a metal, or the like or a combination thereof.

A first impurity region 108a and a second impurity region 108b may be formed at the upper surface of the semiconductor substrate 100. In one embodiment, the first impurity region 108a and the second impurity region 108 contact side surfaces of corresponding ones of the resistance patterns 114. In another embodiment, the first impurity region 108a, the second impurity region 108b and the resistance patterns 114 may define the channel region. In one embodiment, the gate electrode pattern 118 may extend along a horizontal direction opposite a direction along which the first and second impurity regions 108a and 108b extend.

In one embodiment, bottoms of the first impurity region 108a and the second impurity region 108b may be lower than bottom surfaces of the resistance patterns 114.

As illustrated, the first impurity region 108a and the second impurity region 108b are positioned at outer sides of the resistance patterns 114. Accordingly, resistances of the resistance patterns 114 may vary in accordance with voltages applied to the first impurity region 108a and the second impurity region 108b.

When the resistance of the resistance patterns 114 is lowered, a current path that directly connects the first impurity region 108a and the second impurity region 108b through the channel region may be formed. Thus, a current flowing between the first impurity region 108a and the second impurity region 108b through the channel region may be increased when the resistance of the resistance patterns 114 is lowered.

In contrast, when the resistance of the resistance patterns 114 is increased, the resistance patterns 114 insulate the first impurity region 108a and the second impurity region 108b from the channel region. Thus, although the channel region may be formed between the first impurity region 108a and the second impurity region 108b, a current may not flow between the first impurity region 108a and the second impurity region 108b through the channel region. Although a current path may be formed between the first impurity region 108a and the second impurity region 108b outside the channel region, the amount of current flowing through such a current path is small because such a current path is too long.

Figure 2:
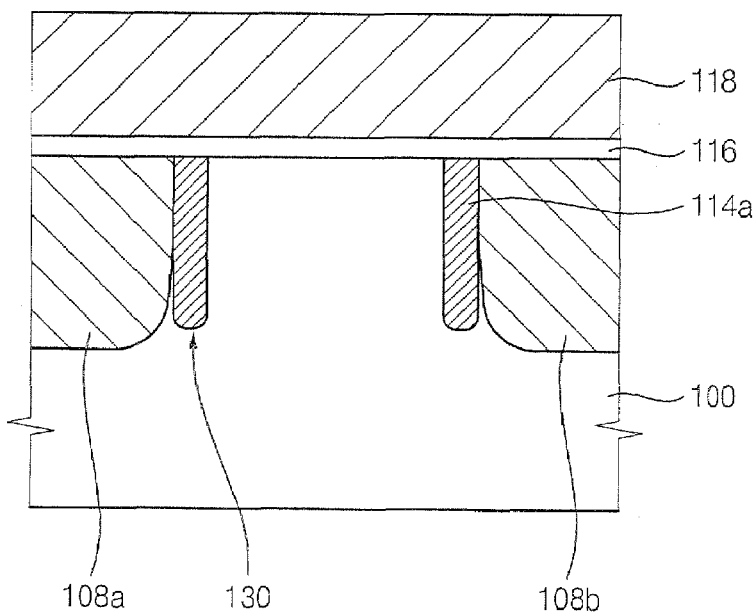
FIG. 2 is a cross-sectional view illustrating a second exemplary embodiment of a non-volatile memory device.

FIG. 2 is a cross-sectional view illustrating a second embodiment of a non-volatile memory device. In one embodiment, the non-volatile memory device shown in FIG. 2 is similar in many respects to the non-volatile memory device shown in FIG. 1, except for a shape of the resistance pattern. Thus, the same reference numerals refer to the same elements.

Referring to FIG. 2, two recesses 130 are formed at a surface portion of the semiconductor substrate 100. A region of the semiconductor substrate 100 between the recesses 130 may correspond to a channel region. In one embodiment, the recesses 130 may have a depth within the semiconductor substrate 100 that is substantially the same as a depth of the first impurity region 108a and the second impurity region 108b within the semiconductor substrate 100. The recesses 130 may be filled with resistance patterns 114a including a variable resistance material.

The gate dielectric layer 116 is formed on the semiconductor substrate 100 and the resistance patterns 114a. The gate electrode pattern 118 is formed on the gate dielectric layer 116 to cover the resistance patterns 114a.

The first impurity region 108a and the second impurity region 108b are formed in the semiconductor substrate 100. The first impurity region 108a and the second impurity region 108 contact side surfaces of corresponding ones of the resistance patterns 114a. Further, the first impurity region 108a, the second impurity region 108b and the resistance patterns 114a may define the channel region. In one embodiment, bottom surfaces of the first impurity region 108a and the second impurity region 108b may be adjacent to bottom surfaces of the resistance patterns 114a.

As shown in FIG. 2, the resistance patterns 114a contact a substantial amount of the side surfaces of the first impurity region 108a and the second impurity region 108b. Therefore, the resistance patterns 114a sufficiently insulate the channel region and the impurity regions 108a and 108b from each other. Further, because a current path between the impurity regions 108a and the 108b outside the channel region, through which current may flow, becomes longer, an amount of current flowing outside the channel region may become smaller. Accordingly, the difference between a programming current and an erasing current may be significantly large. Accordingly, the non-volatile memory device shown in FIG. 2 may readily differentiate data.

Method of Operating a Non-Volatile Memory Device Including a Resistant Material

Hereinafter, exemplary methods of operating a non-volatile memory device in accordance with one embodiment will now be described in greater detail.

Figure 3:
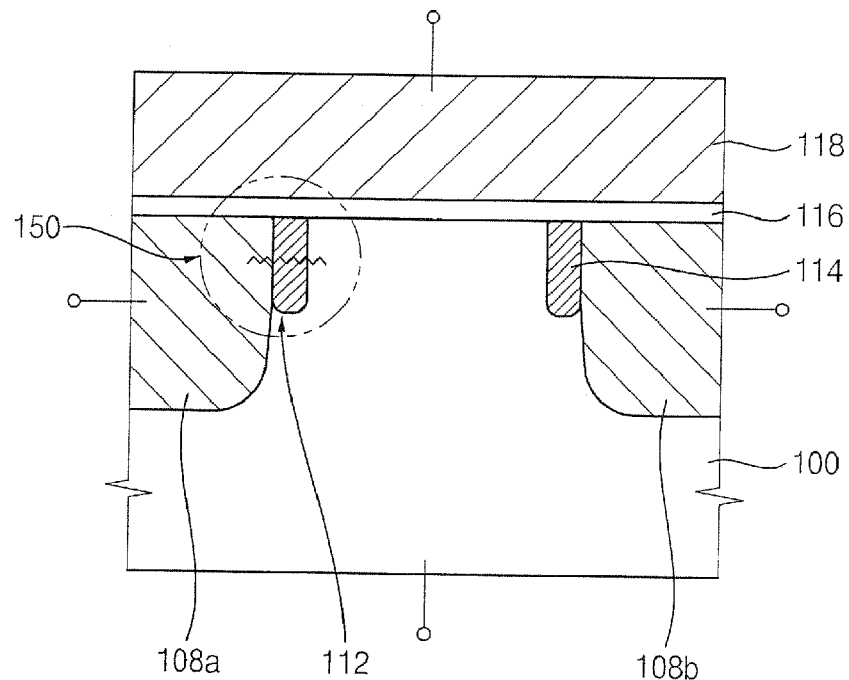
FIG. 3 is a cross-sectional view illustrating a first exemplary method of operating a non-volatile memory device.

Firstly, an exemplary process of programming a cell with data will be described in detail with respect to FIG. 3. FIG. 3 is a cross-sectional view illustrating a first exemplary method of operating a non-volatile memory device.

Referring to FIG. 3, a programming voltage is applied between the semiconductor substrate 100 and the first impurity region 108a. In one embodiment, about 0V is applied to the semiconductor substrate 100. Further, the programming voltage is also applied to the first impurity region 108a. Here, the programming voltage may correspond to a voltage sufficient to decrease the resistance of the resistance pattern 114. Further, a substantially constant voltage of about 0V or less may be applied to the gate electrode pattern 118.

When the programming voltage is applied to the first impurity region 108a, the resistance of the resistance pattern 114 contacting the first impurity region 108a may be decreased. Accordingly, a current path directly connecting the impurity regions 108a and 108b through the channel region may be formed.

Next, an exemplary process for erasing data from a cell will be described in detail with respect to FIG. 1.

Referring to FIG. 1, an erasing voltage is applied between the semiconductor substrate 100 and the first impurity region 108a. In one embodiment, about 0V is applied to the semiconductor substrate 100. Further, the erasing voltage is applied to the first impurity region 108a. The erasing voltage may substantially correspond to a voltage sufficient to increase the resistance of the resistance pattern 114. Further, a substantially constant voltage of about 0V or less may be applied to the gate electrode pattern 118.

When the erasing voltage is applied to the first impurity region 108a, a resistance of the resistance pattern 114 contacting the first impurity region 108a may be increased. Thus, the resistance pattern 114 may insulate one side of the first impurity region 108a so that the current path may be cut off.

According to the process exemplarily described above, data may be erased from a single cell. In another embodiment, however, data may be erased from an array of cells simultaneously. For example, an erasing voltage may be applied to the semiconductor substrate 100. Further, about 0V may be applied to the first impurity region 108a and the second impurity region 108b. Thus, data may be simultaneously erased from a plurality of the cells on the semiconductor substrate 100.

An exemplary process for reading data in a cell to determine whether the data has been programmed or erased will now be described in greater detail below.

The data in the cell is read by determining whether the current flowing between the resistance patterns 114 in the semiconductor substrate 100 exceeds a reference voltage or not. For example, a reading voltage may be applied to the gate electrode pattern 118 and the second impurity region 108b. When the reading voltage is applied to the gate electrode pattern 118, the channel region is formed in the semiconductor substrate 100 under the gate electrode pattern 118. Further, about 0V is applied to the first impurity region 108a. A current flowing from the first impurity region 108a to the second impurity region 108b is then measured. When the measured current is not less than the reference voltage, the cell is determined to be a programmed cell. In contrast, when the measured current is not more than the reference voltage, the cell is determined as an erased cell.

Hereinafter, exemplary methods of operating a non-volatile memory device in accordance with another embodiment will now be described in greater detail.

Figure 4:
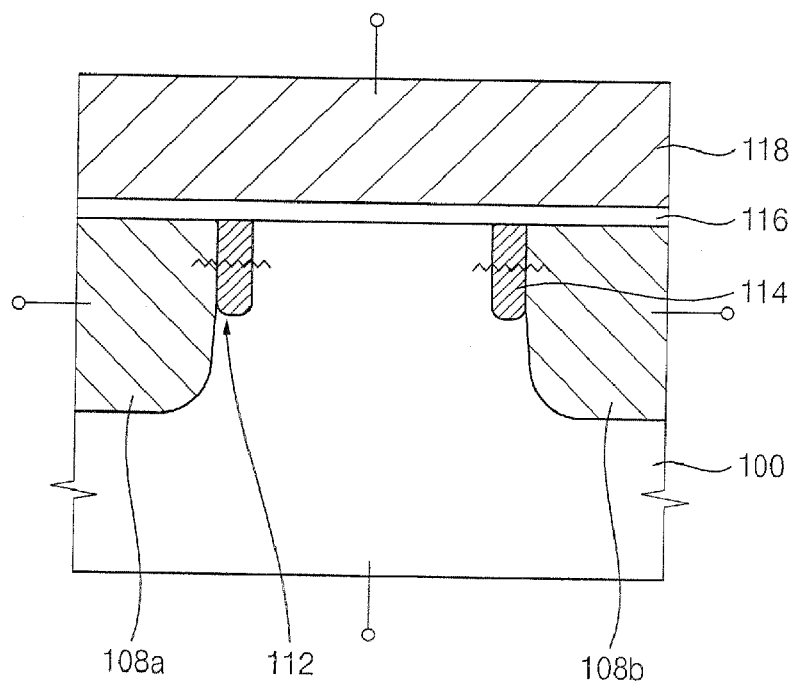
FIG. 4 is a cross-sectional view illustrating a second exemplary method of operating a non-volatile memory device.

Firstly, an exemplary process of programming a cell with data will be described in detail with respect to FIG. 4. FIG. 4 is a cross-sectional view illustrating a second exemplary method of operating a non-volatile memory device.

Referring to FIG. 4, a programming voltage is applied between the semiconductor substrate 100 and the first impurity region 108a. Further, the programming voltage is also applied between the semiconductor substrate 100 and the second impurity region 108b.

In one embodiment, about 0V is applied to the semiconductor substrate 100. Further, the programming voltage is applied to the first impurity region 108a and the second impurity region 108b, respectively. Further, a substantially constant voltage of about 0V or less is applied to the gate electrode pattern 118.

When the programming voltage is applied to the first impurity region 108a and the second impurity region 108b, resistances of the resistance patterns 114 contacting the first impurity region 108a and the second impurity region 108b may be decreased. Accordingly, a current path directly connecting the impurity regions 108a and 108b through the channel region may be formed.

Next, an exemplary process for erasing data from a cell will be described in detail with respect to FIG. 1.

Referring to FIG. 1, about 0V is applied to the semiconductor substrate 100. Further, an erasing voltage is applied to the first impurity region 108a and the second impurity region 108b, respectively. A substantially constant voltage of about 0V or less is applied to the gate electrode pattern 118.

When the erasing voltage is applied to the first impurity region 108a and the second impurity region 108b, resistances of the resistance patterns 114 contacting the first impurity region 108a and the second impurity regions 108b may be increased. Thus, the resistance pattern 114 may insulate the sides of the first impurity region 108a and the second impurity region 108b so that the current path may be cut off.

According to the process exemplarily described above, data may be erased from a single cell. In another embodiment, however, data may be erased from an array of cells simultaneously according to a process substantially the same as that illustrated with reference to FIG. 3.

An exemplary process for reading data in a cell to determine whether the data has been programmed or erased will now be described in greater detail below.

When the data is programmed and erased by the process of this example embodiment, the reading voltage is applied to any one of the first impurity region 108a and the second impurity region 108b. Further, about 0V is applied to a remaining impurity region to which the reading voltage is not applied. Furthermore, the reading voltage is also applied to the gate electrode pattern 118. A current flowing between the first impurity region 108a and the second impurity region 108b is then measured. When the measured current is not less than the reference voltage, the cell is determined to be a programmed cell. In contrast, when the measured current is not more than the reference voltage, the cell is determined to be an erased cell.

Hereinafter, an exemplary method of operating a non-volatile memory device in accordance with yet another embodiment will now be described in greater detail. In this embodiment, the exemplary method may be used to write and read two bits in a single cell. According to this method, although the cell is described as a single cell, the two bits may be written and read in two storage regions of the single cell so that the non-volatile memory device may be highly integrated.

Firstly, an exemplary process of programming data in a first storage region of the cell will be described in detail with reference to FIG. 3.

Referring to FIG. 3, the first storage region 150 of the cell is adjacent to the first impurity region 108a.

A programming voltage is applied between the semiconductor substrate 100 and the first impurity region 108a. In one embodiment, about 0V is applied to the semiconductor substrate 100. Further, the programming voltage is applied to the first impurity region 108a. Further, a substantially constant voltage of about 0V or less is applied to the gate electrode pattern 118.

When the programming voltage is applied to the first impurity region 108a, a resistance of the resistance pattern 114 contacting the first impurity region 108a may be decreased. Thus, a current path directly connecting the first impurity region 108a and the channel region may be formed.

Hereinafter, an exemplary process of programming data in a second storage region of the cell will be described in detail with reference to FIG. 5.

Figure 5:
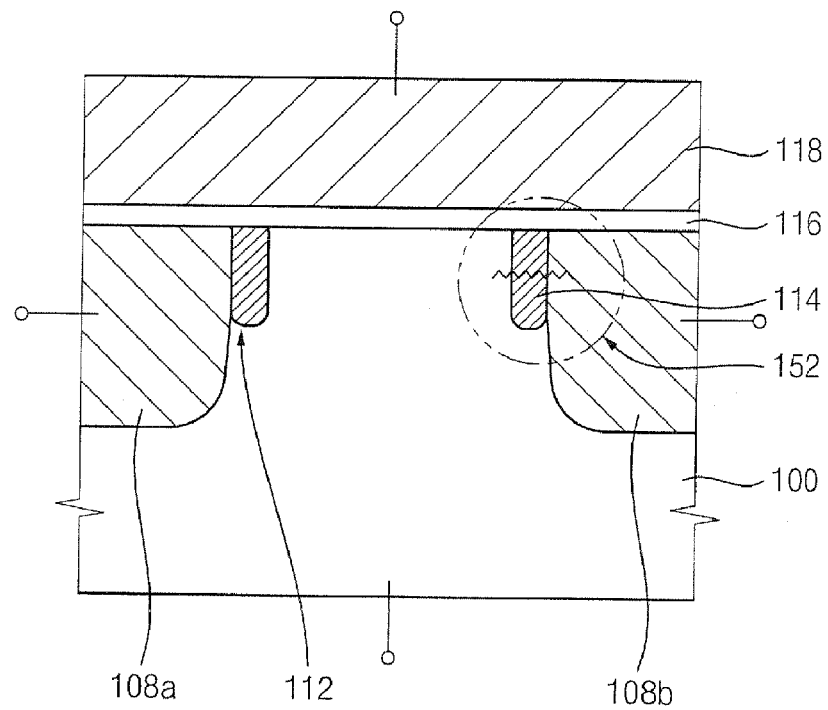
FIG. 5 is a cross-sectional view illustrating a third exemplary method of operating a non-volatile memory device.

Referring to FIG. 5, the second storage region 152 is adjacent to the second impurity region 108b.

A programming voltage is applied between the semiconductor substrate 100 and the second impurity region 108b. In one embodiment, about 0V is applied to the semiconductor substrate 100. Further, the programming voltage is applied to the second impurity region 108b. Further, a substantially constant voltage of about 0V or less is applied to the gate electrode pattern 118.

When the programming voltage is applied to the second impurity region 108b, a resistance of the resistance pattern 114 contacting the second impurity region 108b may be decreased. Thus, a current path directly connecting the second impurity region 108b and the channel region may be formed.

Next, an exemplary process for erasing data from the first storage region 150 of the cell will be described in detail with respect to FIG. 1.

Referring to FIG. 1, an erasing voltage is applied between the semiconductor substrate 100 and the first impurity region 108a. In one embodiment, about 0V is applied to the semiconductor substrate 100. The erasing voltage is applied to the first impurity region 108a. A substantially constant voltage of about 0V or less is applied to the gate electrode pattern 118.

When the erasing voltage is applied to the first impurity region 108a, the resistance of the resistance pattern 114 contacting the first impurity region 108a may be increased. Thus, the resistance pattern 114 may insulate one side of the first impurity region 108a so that the current path may be cut off.

Next, an exemplary process for erasing data from the second storage region 152 of the cell will be described in detail with respect to FIG. 1.

Referring to FIG. 1, an erasing voltage is applied between the semiconductor substrate 100 and the second impurity region 108b. In one embodiment, about 0V is applied to the semiconductor substrate 100. The erasing voltage is applied to the second impurity region 108b. A substantially constant voltage of about 0V or less is applied to the gate electrode pattern 118.

When the erasing voltage is applied to the second impurity region 108b, the resistance of the resistance pattern 114 contacting the second impurity region 108b may be increased. Thus, the resistance pattern 114 may insulate one side of the second impurity region 108b so that the current path may be cut off.

According to the processes exemplarily described above, data may be erased from the first storage region 150 and the second storage region 152 separately. In another embodiment, however, data may be erased from the first storage region 150 and the second storage region 152 simultaneously by a process substantially the same as that described above with reference to FIG. 3.

An exemplary process for reading data in the first storage region 150 of the cell will now be described in greater detail below.

A reading voltage is applied to the gate electrode pattern 118 and the second impurity region 108b. Further, about 0V is applied to the first impurity region 108a. The reading voltage applied to the second impurity region 108b may sufficient convert a portion of the resistance pattern 114 adjacent to the second impurity region 108b into a depletion region. Further, a current value flowing between the first impurity region 108a and the second impurity region 108b may vary in accordance with the resistance pattern 114 adjacent to the first impurity region 108a, regardless of conditions of the resistance pattern 114 adjacent to the second impurity region 108b.

A current flowing from the first impurity region 108a to the second impurity region 108b is then measured. When the measured current is not less than the reference voltage, the first storage region 150 of the cell is determined to be a programmed storage region. In contrast, when the measured current is not more than the reference voltage, the first storage region 150 of the cell is determined to be an erased storage region.

An exemplary process for reading data in the second storage region 152 of the cell will now be described in greater detail below.

A reading voltage is applied to the gate electrode pattern 118 and the first impurity region 108a. Further, about 0V is applied to the second impurity region 108b. The reading voltage applied to the first impurity region 108a may sufficiently convert a portion of the resistance pattern 114 adjacent to the first impurity region 108a into a depletion region. The current value flowing between the first impurity region 108a and the second impurity region 108b may vary in accordance with the resistance pattern 114 adjacent to the second impurity region 108b, regardless of conditions of the resistance pattern 114 adjacent to the first impurity region 108a.

A current flowing from the second impurity region 108b to the first impurity region 108a is then measured. When the measured current is no less than the reference voltage, the second storage region 152 of the cell is determined to be a programmed storage region. In contrast, when the measured current is no more than the reference voltage, the second storage region 152 of the cell is determined to be an erased storage region.

As exemplarily described above, data may be independently programmed and erased into/out of the first storage region 150 and the second storage region 152 of the cell. Further, the data in the first storage region 150 and the second storage region 152 may be independently read.

Method of Manufacturing a Non-Volatile Memory Device

FIGS. 6 to 12 are cross-sectional views illustrating an exemplary method of manufacturing the non-volatile memory device shown in FIG. 1.

Figure 6:
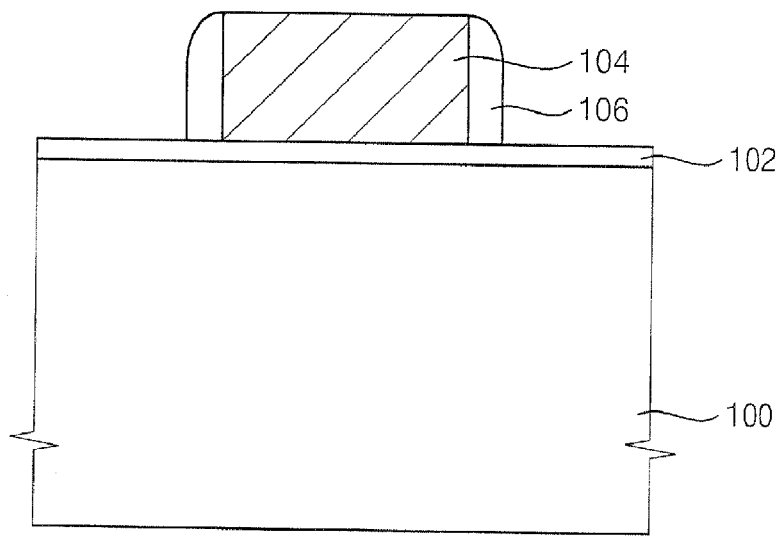
FIGS. 6 to 12 are cross-sectional views illustrating a method of manufacturing the non-volatile memory device in FIG. 1.

Referring to FIG. 6, a semiconductor substrate 100 is prepared. In one embodiment, the semiconductor substrate 100 may include, for example, a single crystalline silicon substrate.

A sacrificial layer 102 and a first hard mask layer (not shown) are sequentially formed on the semiconductor substrate 100. The first hard mask layer is then patterned to form a first hard mask pattern 104 exposing portions of the sacrificial layer 102 where a first impurity region and a second impurity region are to be formed.

A spacer layer (not shown) is formed on the first hard mask pattern 104 and the sacrificial layer 102. In this example embodiment, the spacer layer may include a material having an etching selectivity with respect to the first hard mask pattern 104. In one embodiment, the first hard mask pattern 104 may include a material such as silicon nitride and the spacer layer may include a material such as polysilicon.

The spacer layer is then anisotropically etched to form spacers 106 on sidewalls of the first hard mask pattern 104.

Figure 7:
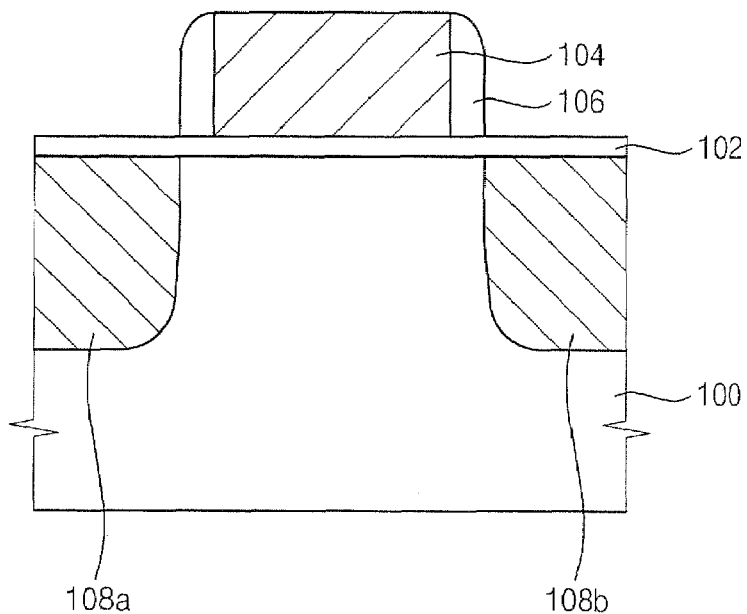

Referring to FIG. 7, impurities are implanted into the semiconductor substrate 100 using the first hard mask pattern 104 and the spacers 106 as an ion implantation mask to form a first impurity region 108a and a second impurity region 108b in the semiconductor substrate 100. The sacrificial layer 102 may prevent the semiconductor substrate 100 from becoming damaged during the ion implantation process. In one embodiment, the first impurity region 108a and the second impurity region 108b may be doped with n-type impurities.

Figure 8:
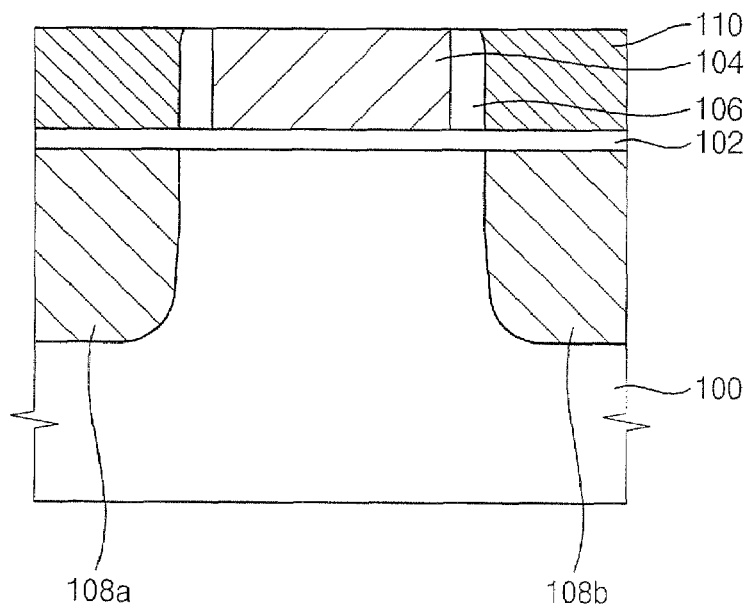

Referring to FIG. 8, a second hard mask layer (not shown) is formed on the first hard mask pattern 104 and the sacrificial layer 102. In one embodiment, the second hard mask layer may have an upper surface that is higher than an upper surface of the first hard mask pattern 104.

In one embodiment, the second hard mask layer and the first hard mask pattern 104 may include substantially the same material. In another embodiment, the second hard mask layer and the first hard mask pattern 104 may include different materials. In such an embodiment, the second hard mask may include a material having an etching selectivity with respect to the spacers 106.

The second hard mask layer may then be patterned (e.g., polished) until the upper surfaces of the first hard mask pattern 104 and the spacers 106 are exposed, thereby forming a second hard mask pattern 110 at sides of the spacers 106.

Figure 9:
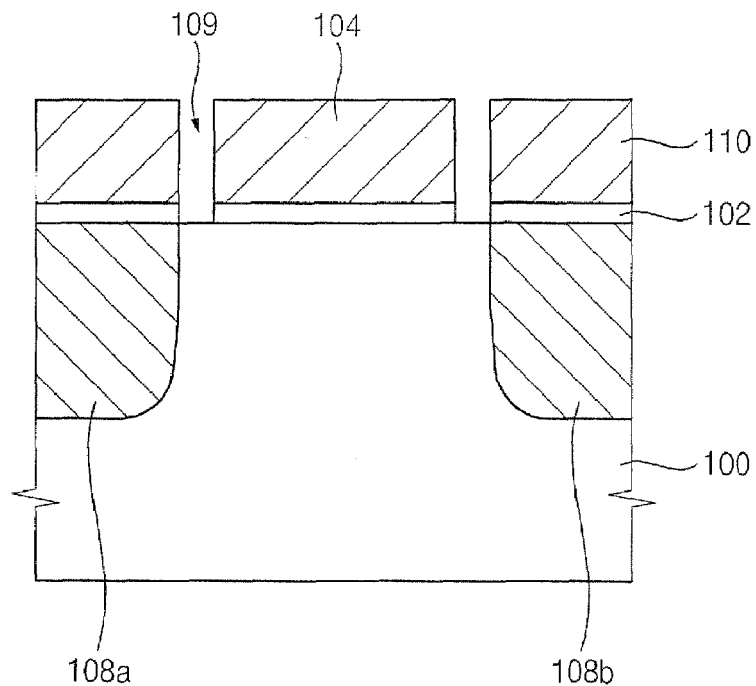

Referring to FIG. 9, the spacers 106 are then removed to expose portions of the sacrificial layer 102. The exposed portions of the sacrificial layer 102 are then removed to form openings 109 between the first hard mask pattern 102 and the second hard mask pattern 104. In one embodiment, the spacers 106 and the sacrificial layer 102 may be removed by a wet etching process. By removing the spacers 106 and the sacrificial layer 102 by a wet etching process, damage that may otherwise be incurred to the surface of the semiconductor substrate 100 may be suppressed.

Figure 10:
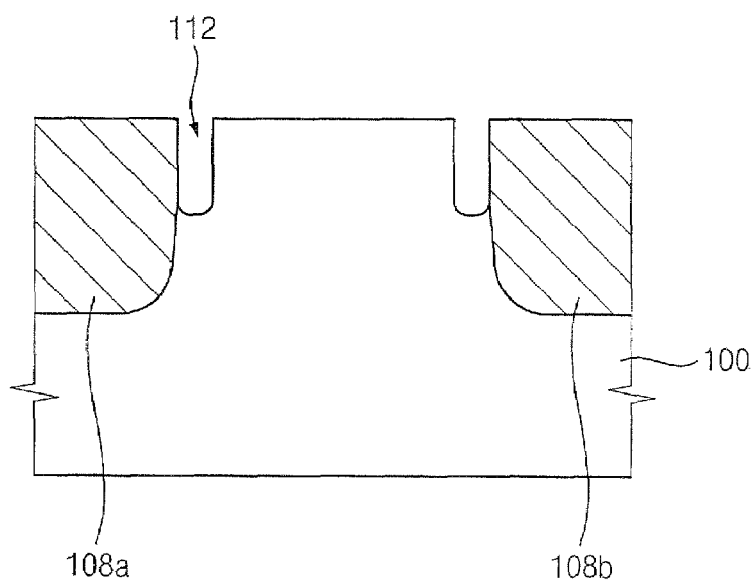

Referring to FIG. 10, portions of the semiconductor substrate 100 exposed by the openings 109 are etched using the first hard mask pattern 102 and the second hard mask pattern 104 as an etching mask, thereby forming recesses 112 in the semiconductor substrate 100. Side surfaces of the first impurity region 108a and the second impurity region 108b may be exposed to the recesses 112. The first hard mask pattern 102 and the second hard mask pattern 104 may be removed after forming the recesses 112.

In one embodiment, bottom surfaces of the recesses 112 may be higher than bottom surfaces of the first impurity region 108a and the second impurity region 108b. In another embodiment, bottom surfaces of the recesses 112 may be adjacent to bottom surfaces of the first impurity region 108a and the second impurity region 108b (thereby facilitating the formation of the non-volatile memory device shown in FIG. 2).

Figure 11:
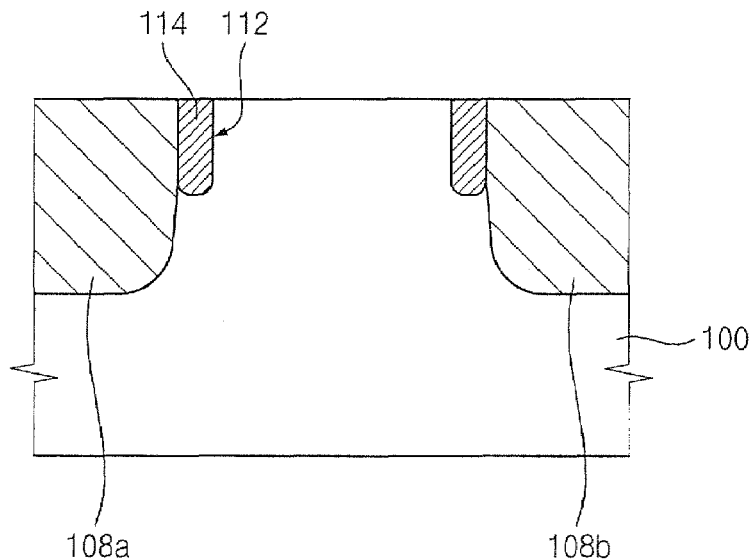

Referring to FIG. 11, a resistance layer (not shown) is then formed on the semiconductor substrate 100, the first impurity region 108a and the second impurity region 108b to substantially fill the recesses 112. In one embodiment, the resistance layer may include a variable resistance material. For example, the resistance layer may include a material such as zirconium oxide ($ZrO_x$), tantalum oxide ($TaO_x$), niobium oxide ($NiO_x$), strontium zirconium oxide doped with chrome (Cr-doped $StZrO_x$), or the like or a combination thereof. In another embodiment, the resistance layer may include a stacked structure including a first metal oxide layer and a second metal oxide layer sequentially stacked. For example, the first metal oxide layer may have an oxygen composition ratio that lower than a chemically stable oxygen composition ratio and the second metal oxide layer may have a chemically stable oxygen composition ratio.

The resistance layer is then patterned (e.g., polished) until the surface of the semiconductor substrate 100 is exposed to form resistance patterns 114 in the recesses 112. Thus, upper faces of the resistance pattern 114 and the semiconductor substrate 100 may be positioned on a substantially same plane.

Figure 12:
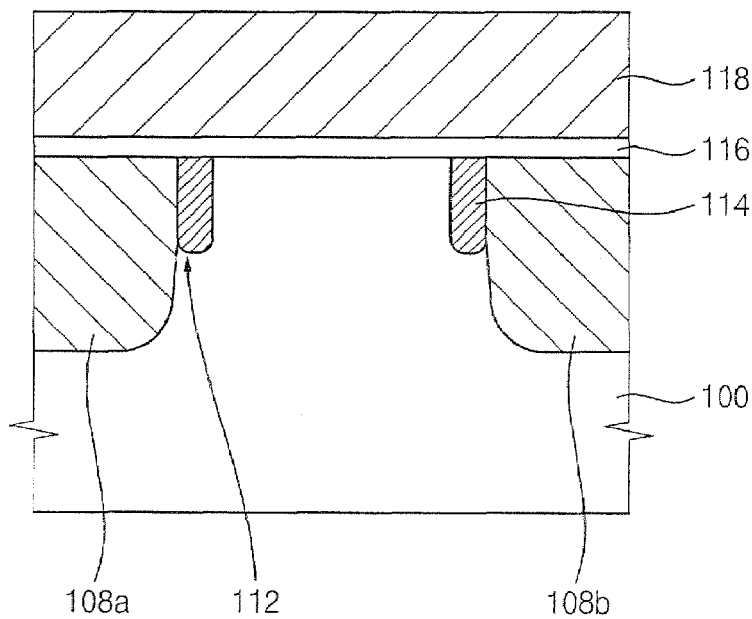

Referring to FIG. 12, a gate dielectric layer 116 is then formed on the semiconductor substrate 100 and on the resistance patterns 114. In one embodiment, the gate dielectric layer 116 may include a material such as silicon oxide. In another embodiment, the gate dielectric layer 116 may include metal oxide having a dielectric constant higher than a dielectric constant of silicon oxide. Such a gate dielectric layer 116 including a metal oxide material may be formed by a metal organic chemical vapor deposition (MOCVD) process, an atomic layer deposition (ALD) process, or the like or a combination thereof.

A gate conductive layer (not shown) is then formed on the gate dielectric layer 116. In one embodiment, the gate conductive layer may, for example, include polysilicon doped with impurities. In another embodiment, the gate conductive layer may include a metal.

A third hard mask pattern (not shown) is formed on the gate conductive layer. The gate conductive layer is then etched using the third hard mask pattern using an etching mask to form a gate electrode pattern 118 covering the semiconductor substrate 100 between the resistance patterns 114. In one embodiment, the gate electrode pattern 118 may have a substantially linear shape that extends across the semiconductor substrate 100 along a first direction to cover the first impurity region 108a and the second impurity region 108b.

According to embodiments of the present invention exemplarily described above, interference between the cells and a cell distribution may be reduced so that the non-volatile memory device may have excellent operational characteristics. Further, because the non-volatile memory device may have an array structure as a NAND-type as well as a low operational voltage, the non-volatile memory device may be highly integrated. As a result, the non-volatile memory device may be manufactured by a simple process and with low cost.

Non-limiting examples of the embodiments described above will now be provided in the paragraphs below.

A non-volatile memory device in accordance with one embodiment includes a substrate, a resistance pattern, a gate dielectric layer, a gate electrode pattern, a first impurity region and a second impurity region. The substrate has recesses. The recesses are filled with the resistance pattern. Further, the resistance pattern includes a variable resistance material in accordance with a voltage. The gate dielectric layer is formed on the substrate. The gate electrode pattern is formed on the gate dielectric layer to cover the resistance pattern. The first and second impurity regions are formed in the substrate. The first impurity region and the second impurity region make contact with side faces of the resistance pattern. Further, the resistance pattern, the first impurity region and the second impurity region define a channel region.

According to one embodiment, the resistance pattern may include metal oxide. The metal oxide may include zirconium oxide, tantalum oxide, etc.

According to another embodiment, the resistance pattern may have a bottom face higher than those of the first impurity region and the second impurity region. Further, the bottom face of the resistance pattern may extend to the bottom faces of the first impurity region and the second impurity region.

According to still another embodiment, the gate electrode pattern may have a linear shape extending along a first direction.

In an exemplary method of manufacturing a non-volatile memory device, impurities are implanted into a substrate to form a first impurity region and a second impurity region. The substrate is partially etched to form recesses exposing side faces of the first impurity region and the second impurity region. The recesses are then filled with a resistance pattern. A gate dielectric layer is formed on the substrate. A gate electrode pattern is then formed on the gate dielectric layer to cover the resistance pattern.

According to one embodiment, forming the first impurity region and the second impurity region may include forming a first mask pattern on the substrate to expose regions of the substrate where the first impurity region and the second impurity region are to be formed, and implanting the impurities into the regions of the substrate using the first mask pattern as an ion implantation mask.

Further, forming the recesses may include forming a spacer on a sidewall of the first mask pattern. A mask layer having an upper face higher than that of the first mask pattern is formed on the substrate having the spacer. The mask layer is then partially removed until upper faces of the first mask pattern and the spacer are exposed to form a second mask pattern. The spacer is selectively etched. The substrate is then etched using the first mask pattern and the second mask pattern as an etching mask to form the recesses.

According to another embodiment, the resistance pattern may include metal oxide.

According to still another embodiment, the gate electrode pattern may have a linear shape extending along a first direction.

In a method of operating a non-volatile memory device, which includes a substrate having recesses, a resistance pattern having a variable resistance material that fills up the recesses, a gate dielectric layer formed on the substrate, a gate electrode pattern formed on the gate dielectric layer to cover the resistance pattern, a first impurity region and a second impurity region formed in the substrate and making contact with side faces of the first impurity region and the second impurity region to define a channel region together with the resistance pattern, in accordance with still another aspect of the present invention, a first voltage is applied to the first impurity region to decrease a resistance of the resistance pattern, thereby programming a selected cell with data. A second voltage is then applied to the first region to increase the resistance of the resistance pattern, thereby erasing the data from the selected cell. Reading voltages are applied to the gate electrode and the second impurity region, respectively. A current flowing from the first impurity region to the second impurity region is then measured to read the data in the selected cell.

According to one embodiment, programming the selected cell may further include applying the first voltage to the second impurity region.

Further, erasing the data may further include applying the second voltage to the second impurity region.

According to another embodiment, the selected cell may have first storage region programmed with the data and a second storage region. The first voltage may be applied to the second impurity region to decrease the resistance of the resistance pattern, thereby programming the second storage region with data. The second voltage may be applied to the second impurity region to increase the resistance of the resistance pattern, thereby erasing the data from the second storage region. Further, the reading voltages may be applied to the gate electrode and the first impurity region, respectively. A current flowing from the second impurity region to the first impurity region is then measured to read the data in the second storage region of the selected cell.

According to still another embodiment, each of the cells in the non-volatile memory device may have an array shape. Further, data in the cells may be simultaneously erased by applying an erasing voltage to the substrate, and applying a voltage of about 0V to the first impurity region and the second impurity region.

According to yet another embodiment, reading the data may include recognizing the selected cell as a programmed state when the current may be no less than a reference current, and as an erased state when the current may be no more than the reference current.

According to the embodiments exemplary described herein, data may be programmed or erased by changing the resistance of the resistance pattern so that interference between the cells and the cell distribution may be reduced. Further, an operational voltage, which is applied from an external, for change the resistance may be greatly lower than that of a conventional memory device that may be charged and/or discharged with charges by an F-N tunneling. Thus, forming semiconductor devices such as a high voltage transistor on a peripheral region and a core region may not be required in the non-volatile memory device exemplarily described above. Furthermore, since the non-volatile memory device may store and read two bits in the single cell, the non-volatile memory device may readily be highly integrated.

Having exemplarily described the embodiments of the present invention above, it is noted that modifications and variations may be made by persons skilled in the art in light of the above teachings. It is therefore to be understood that changes may be made in the particular embodiment of the present invention disclosed which is within the scope and the spirit of the invention outlined by the appended claims.

What is claimed is:

1. A non-volatile memory device comprising:
a substrate having recesses;
resistance patterns filling the recesses, the resistance patterns including a material having a resistance that is variable in accordance with a voltage applied thereto;
a gate dielectric layer formed on the substrate;
a gate electrode pattern formed on the gate dielectric layer; and
first and second impurity regions formed at a surface of the substrate, the first and second impurity regions contacting side surfaces of the resistance patterns to define a channel region between the resistance patterns.

2. The non-volatile memory device of claim 1, wherein the gate electrode pattern covers the resistance patterns.

3. The non-volatile memory device of claim 1, wherein the resistance patterns comprise metal oxide.

4. The non-volatile memory device of claim 3, wherein the resistance patterns comprise zirconium oxide, tantalum oxide, or a combination thereof.

5. The non-volatile memory device of claim 1, wherein bottom surfaces of the resistance patterns are higher than bottom surfaces of the first and the second impurity regions.

6. The non-volatile memory device of claim 1, wherein bottom surfaces of the resistance patterns are substantially coplanar with bottom surfaces of the first and the second impurity regions.

7. The non-volatile memory device of claim 1, wherein the gate electrode pattern has a substantially linear shape.

8. A method of manufacturing a non-volatile memory device, comprising:
implanting impurities into a surface of a substrate to form first and second impurity regions;
partially etching the substrate to form recesses exposing the first and second impurity regions below the surface of the substrate;
filling the recesses with resistance patterns;
forming a gate dielectric layer on the substrate; and
forming a gate electrode pattern on the gate dielectric layer and covering the resistance patterns.

9. The method of claim 8, further comprising covering the resistance patterns with the gate electrode pattern.

10. The method of claim 8, wherein forming the first and second impurity regions comprises:
forming a first mask pattern on the substrate exposing portions of the substrate where the first and the second impurity regions are to be formed; and
implanting the impurities into the substrate using the first mask pattern as an ion implantation mask.

11. The method of claim 10, wherein forming the recesses comprises:
forming spacers on sidewalls of the first mask pattern;
forming a second mask layer on the substrate having the spacers, the second mask layer having an upper surface that is higher than an upper surface of the first mask pattern;
patterning the second mask layer to expose the upper surface of the first mask pattern and upper surfaces of the spacers, thereby forming a second mask pattern;
selectively removing the spacers; and
etching the substrate using the first and the second mask patterns as an etching mask.

12. The method of claim 8, wherein the resistance patterns comprise metal oxide.

13. The method of claim 8, wherein the gate electrode pattern has a substantially linear shape extending along a first direction.

14. A method of operating a non-volatile memory device comprising a plurality of cells, wherein each of the plurality of cells includes recesses formed in a substrate, resistance patterns filling the recesses, a gate dielectric layer formed on the substrate, a gate electrode pattern formed on the gate dielectric layer and first and second impurity regions formed at a surface portion of the substrate, wherein the resistance patterns include a material having a resistance that is variable in accordance with a voltage applied thereto, wherein the first and second impurity regions are formed at a surface of the substrate and wherein the first and the second impurity regions contact side surfaces of the resistance patterns to define a channel region between the resistance patterns, the method comprising:

applying a first voltage to the first impurity region of one of the plurality of cells to decrease a resistance of the resistance pattern contacting the first impurity region, thereby programming the one of the plurality of cells with data;

applying a second voltage to the first impurity region of the one of the plurality of cells to increase the resistance of the resistance pattern contacting the first impurity region, thereby erasing the data from the one of the plurality of cells; and applying a reading voltage to the gate electrode and the second impurity region of the one of the plurality of cells and measuring a current flowing from the first impurity region to the second impurity region of the one of the plurality of cells to read the data in the one of the plurality of cells.

15. The method of claim 14, wherein programming the one of the plurality of cells comprises applying the first voltage to the second impurity region of the one of the plurality of cells.

16. The method of claim 14, wherein erasing the data from the one of the plurality of cells comprises applying the second voltage to the second impurity region of the one of the plurality of cells.

17. The method of claim 14, wherein the one of the plurality of cells has a first storage region and a second storage region, the method further comprising:

applying the first voltage to the second impurity region of the one of the plurality of cells to decrease a resistance of the resistance pattern contacting the second impurity region of the one of the plurality of cells, thereby programming the second storage region of the one of the plurality of cells with data;

applying the second voltage to the second impurity region of the one of the plurality of cells to increase a resistance of the resistance pattern contacting the second impurity region of the one of the plurality of cells, thereby erasing the data from the second storage region of the selected cell; and applying a reading voltage to the gate electrode and the first impurity region of the one of the plurality of cells and measuring a current flowing from the second impurity region of the one of the plurality of cells to the first impurity region of the one of the plurality of cells to read the data in the second storage region of the one of the plurality of cells.

18. The method of claim 14, further comprising applying an erasing voltage to the substrate and about 0V to the first and the second impurity regions of the plurality of cells to simultaneously erase the data from the plurality of cells.

19. The method of claim 14, wherein reading the data comprises:

recognizing the one of the plurality of cells as having a programmed state when the current is not less than a reference current; and recognizing the one of the plurality of cells as having an erased state when the current is not more than the reference current.

\* \* \* \* \*